(12) United States Patent
Storey et al.

(10) Patent No.: US 11,200,356 B2
(45) Date of Patent: Dec. 14, 2021

(54) USING A COMPUTER TO MODEL THE REACTIONS OF OBJECTS TO SIMULATED PHYSICAL INTERACTIONS

(71) Applicant: Nvidia Corporation, Santa Clara, CA (US)

(72) Inventors: Kier Storey, Santa Clara, CA (US); Fengyun Lu, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 203 days.

(21) Appl. No.: 16/379,419

(22) Filed: Apr. 9, 2019

(65) Prior Publication Data

US 2020/0327203 A1 Oct. 15, 2020

(51) Int. Cl.
*G06F 30/20* (2020.01)

(52) U.S. Cl.
CPC .................................. *G06F 30/20* (2020.01)

(58) Field of Classification Search
None
See application file for complete search history.

(56) References Cited

U.S. PATENT DOCUMENTS

| | | | |
|---|---|---|---|
| 7,610,182 B2 | 10/2009 | Smith et al. | |
| 7,657,394 B1 | 2/2010 | Slavik | |
| 8,392,154 B2 | 3/2013 | Choi | |
| 9,020,787 B2 | 4/2015 | Grinspun et al. | |
| 9,122,821 B2 * | 9/2015 | McDaniel | G06F 30/20 |
| 9,440,148 B2 | 9/2016 | Bond et al. | |
| 9,589,383 B2 * | 3/2017 | Mueller-Fischer | G06T 13/20 |
| 9,613,449 B2 | 4/2017 | Mueller-Fischer et al. | |
| 2005/0187742 A1 | 8/2005 | Collodi | |
| 2006/0217945 A1 | 9/2006 | Leprevost | |
| 2006/0262113 A1 | 11/2006 | Leprevost | |
| 2010/0169403 A1 | 7/2010 | DeLaquil et al. | |
| 2012/0078598 A1 | 3/2012 | McDaniel | |
| 2014/0244221 A1 | 8/2014 | Tonge et al. | |

(Continued)

FOREIGN PATENT DOCUMENTS

KR 100924123 B1 10/2009

OTHER PUBLICATIONS

Kenwright; "Real-Time Character Inverse Kinematics using the Gauss-Seidel Iterative Approximation Method"; CONTENT 2012: The Fourth International Conference on Creative Content Technologies; ISBN: 978-1-61208-220 IARIA; 2012; pp. 63-68.

(Continued)

*Primary Examiner* — Steven M Christopher

(57) ABSTRACT

In modeling contact between two or more objects (such as a robotic arm placing a block on a stack of blocks) or articulations of a series of linked joints (such as modeling a backhoe), current techniques can introduce additional energy into the system or fail to resolve a constraint imposed on the system. The current techniques attempt to resolve these issues, for example, by using very small time steps. Very small time steps, however, can significantly increase computational costs of the modeling simulation. The disclosed simulation system for rigid bodies uses a time interval to reduce linearization artifacts due to the small time steps and reduce computational costs with faster solver convergence by permitting more efficient bias calculations. High mass handling can also be improved through the more efficient bias calculations.

22 Claims, 7 Drawing Sheets

(56) References Cited

U.S. PATENT DOCUMENTS

| | | |
|---|---|---|
| 2014/0244222 A1 | 8/2014 | Tonge et al. |
| 2014/0358505 A1* | 12/2014 | Hashash ................ G06F 30/20 703/2 |
| 2017/0185707 A1 | 6/2017 | Rao et al. |
| 2017/0344680 A1* | 11/2017 | Strunk .................... G06F 30/20 |

OTHER PUBLICATIONS

Miguel, et al.; "Efficient Simulation of Contact Between Rigid and Deformable Objects"; Multibody Dynamics 2011, ECCOMAS Thematic Conference; Jul. 4-7, 2011; pp. 1-11.

Teschner, "Simulation in Computer Graphics—Rigid Body Dynamics"; Computer Science Department, University of Freiburg; https://cg.informatik.uni-freiburg.de/course_notes/sim_06_rigidBodies.pdf; 2016; 39 pgs.

Stewart, et al.; "An Implicit Time-Stepping Scheme for Rigid Body Dynamics with Coulomb Friction"; Research for the U.S. Department of Energy under Contract DE-AC04-94AL85000; https://foswiki.cs.rpi.edu/foswiki/pub/RoboticsWeb/LabPublications/STicra00.pdf; undated; 8 pgs.

Lembcke; "Realtime Rigid Body Simulation Using Impulses"; UMM CSCI Senior Seminar Conference; 2006; 5 pgs.

Eichner, Rigid Body Game Physics; "Overview"; http://myselph.de/gamePhysics/index.html; 2014; 17 pgs.

Tonge; "Solving Rigid Body Contacts"; Game Developers Conference; Mar. 5-9, 2012; 59 pgs.

* cited by examiner

USING A COMPUTER TO MODEL THE REACTIONS OF OBJECTS TO SIMULATED PHYSICAL INTERACTIONS

TECHNICAL FIELD

This application is directed, in general, to a system of linear or non-linear constraints solver simulation and, more specifically, to a system of linear or non-linear constraints solver simulation to model object interactions.

BACKGROUND

Computers are used to simulate the interaction between objects of an application, such as in video games, in which a user interacts with objects in a scene. Using computers to robustly, efficiently, and correctly simulate objects, however, can be a challenging task. In an attempt to correct errors due to simulations, existing solutions often use constraints for computer simulations.

For example, rigid body solver simulations can be used for simulating a contact or joint between two rigid objects or bodies. When proper constraints are not used, the rigid body solver simulations can result in errors, such as jitter and stutter, boxes swimming, and piles collapsing. These simulation errors can occur under several conditions, such as when the mass difference between two objects is high, if the angular velocity of one object is high compared to the other object, if relatively large time-steps are used, or if the simulation is performed on smaller scale objects, e.g., toy-sized objects rather than human-scale objects.

A system of linear or non-linear constraints solvers, such as Jacobi and projected gauss seidel algorithms, can be used to define the constraints on the simulation. These iterative solvers utilize a projection of motion of the objects onto linear constraints to enforce contact, positional, and angular constraints. These solvers, however, can fail to fully constrain the simulation because the motion of a rotating object at a point on its surface is non-linear.

Another simulation error can arise when the simulation speed is increased. For example, to run a simulation during the play of a game may require the simulation to run at 60 or more hertz (Hz) to keep the frames per second at an acceptable level. The traditional rigid body solvers may not account for the increase in error that can occur at the higher simulation speeds.

SUMMARY

In one aspect, a method to iteratively resolve a rigid body solver of a simulation is disclosed. In one embodiment, the method includes: (1) calculating a contact vector between a first object and a second object, and an impulse response vector between the first object and the second object, wherein the contact vector and the impulse response vector are determined using the first object as an origin, (2) accumulating a linear delta value and an angular delta value, for each of the first object and the second object, utilizing a time interval value, wherein the time interval value is computed utilizing a number of solver iterations (N-iter) and a time step (dt), (3) updating a bias value utilizing the contact vector, the impulse response vector, a linear bias value, and an angular bias value, wherein the linear bias value utilizes the linear delta value, and the angular bias value utilizes the angular delta value, and (4) iterating the rigid body solver the N-iter times.

In another aspect, a computer program product having a series of operating instructions stored on a non-transitory computer-readable medium that directs a data processing apparatus when executed thereby to perform operations to generate a result from a rigid body solver is disclosed. In one embodiment, the computer program product includes: (1) calculating a contact vector between a first object and a second object, and an impulse response vector between the first object and the second object, wherein the contact vector and the impulse response vector are determined using the first object as an origin, (2) accumulating a linear delta value and an angular delta value, for each of the first object and the second object, utilizing a time interval value, wherein the time interval value is computed, utilizing the N-iter and the dt, (3) updating a bias value utilizing the contact vector, the impulse response vector, a linear bias value, and an angular bias value, wherein the linear bias value utilizes the linear delta value, and the angular bias value utilizes the angular delta value, (4) iterating the rigid body solver the N-iter times, wherein the iterating ends when an exit condition is satisfied, and (5) communicating the result, wherein the result is a set of parameters representing the contact vector, the impulse vector, the bias value, and constraint parameters.

In another aspect, a rigid body solver system is disclosed. In one embodiment, the system includes: (1) a data receiver, operable to receive an initial set of parameters for a rigid body simulation, (2) a data communicator, operable to transmit a result set, and (3) a processor, operable to determine a time interval and a time step, operable to calculate an accumulation of a linear delta value and an angular delta value for two or more objects utilizing the time interval and the time step, operable to update a bias value utilizing the linear delta value and the angular delta value, and operable to generate the result set utilizing a rigid body solver, the time interval, the time step, a number of iterations, the bias value, and the initial set of parameters.

BRIEF DESCRIPTION

Reference is now made to the following descriptions taken in conjunction with the accompanying drawings, in which.

DETAILED DESCRIPTION

Figure 1:
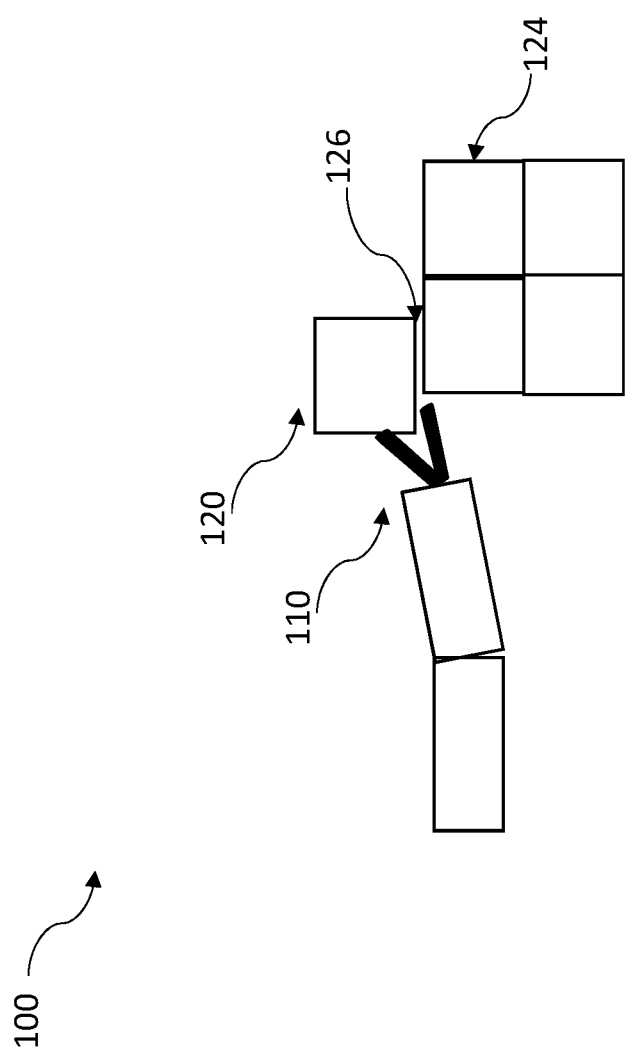
FIG. 1 is an illustration of a diagram of an example contact model simulation.

Animating a single object can easily be done by hand. For example, animating a single box falling from the top of a pile of boxes is not difficult. Animating hundreds of boxes falling and the pile of boxes collapsing, however, can be difficult. To capture such scenes, computer simulation is typically used. This is especially true for real-time applications such as games, in which a user interacts with objects in a scene and the user interaction is unpredictable. Computers can simulate each of the objects and the results of what happens when the objects interact with each other. For example, objects may collide (such as two vehicles hitting each other), bounce off of each other (such as a basketball bouncing off the hoop rim), break (such as a baseball going through a window), or push one or the other off in a new direction (such as billiard balls hitting each other).

Computers may need to solve a lot of computations to generate the simulations. Using a collision of swords as an example, the velocity of the swords being swung, the strength of the characters swinging the sword, the footing of the characters, and the wrist strength of the characters can all be factors that determine the outcome of the swords' collision. The outcome can be the swords moving in a particular direction, or perhaps the swords are relatively motionless, but the character's feet slip in mud. Combining the relevant motions and velocities (e.g., speed of an object in a particular direction), and other factors of each object in the model, such as a simulated person, sword, ground cover, and other objects, and then computing an outcome quickly can be challenging.

Solving the multiple computations can take a significant amount of time, especially as the simulations get more complex with more and more objects present in the area where the objects interact. For example, a highly complex simulation may involve hundreds of different grass blades and weeds interacting with a person's foot slipping across the ground or may involve modeling hundreds of building girders and pylons during an earthquake. Existing processes, i.e., solvers, which are commonly used to solve or resolve the simulation of interacting objects, may take a long time to get to an answer. This is not good in the middle of a video game as a sword is being swung. To speed up the process, computers may simplify simulations to decrease the amount of computations required. This, however, affects the quality of the simulation.

Introduced herein is a new way to solve simulations, i.e., to get a result of the objects interacting with each other, that uses small time slices of information. At each time slice, e.g., time interval, the simulation updates itself with a partial resolution. The partial resolution is then used to update the simulation parameters. The simulation parameters include the position of each object, its speed/velocity, and the direction the object is moving. The simulation is executed again with the new parameters. This continues until all of the time slices/intervals are used up. This new way to solve simulations can provide a more accurate simulation result without increasing the computing time needed to generate that result.

The computer simulations can be executed in a testing type environment, for example, testing a robotic arm for a space based robotic mission or testing an industrial robot in an industrial environment, e.g., a robot arm building a car. Simulations can also be executed within an application as noted above, such as a game where boxes are stacked on top of one another or a collision between two swords held by avatars. Real time and near real time simulations can also be used in other situations, for example, as part of a prosthetic arm to help a user control the arm without breaking a glass or an egg.

These simulations can be generalized as any system of linear or non-linear constraints, e.g., rigid body, particle, fluid, cloth, and soft body simulations. For this disclosure, rigid body solvers will be utilized for examples. Rigid body solvers are utilized by these simulations to determine what happens as the rigid body moves, interacts with other objects, and interacts with other parts of its self. A rigid body movement can be a joint simulation, i.e., a rigid body joint solver. For example, a joint simulation can involve modeling a robotic arm where the clasper, i.e., manipulator or hand, is rotated, and one section of the robotic arm is moved. A rigid body interaction can be a contact simulation. For example, a contact simulation can involve modeling the stacking of boxes on top of one another, or the interaction of two swords colliding in a game. A rigid body interaction with other parts of its self can be an articulation simulation. For example, an articulation simulation can be a backhoe that includes the main body, a two part arm segment, and a scooper. Each part of the articulation is a link Movement of one or both of the arm segments directly influences, e.g., controls, the movement of the scooper element as well.

Objects can be a movable object (for example, a vehicle, a weapon, a cloth, or a fluid) or unmovable object (for example, a rock wall or a building) with which a movable object interacts. The movement of each of these objects, or parts thereof, can be expressed as a linear movement and an angular movement. A linear movement is a movement in a line, typically expressed as a vector representing the translational motion of the center of mass of the rigid body or link Movement up, down, left, right, forward, backward, are examples of linear movement. The backhoe can lift an arm segment causing that segment to move in the simulated space. An angular movement is a movement of rotation. Turning 90° (degrees) to the left is an example of an angular movement. In the backhoe example above, when the arm segment is lifted up, there is also angular movement. Since the arm segment is attached to the backhoe base, the arm segment has to pivot on the joint between the backhoe and the arm segment as it is lifted up. The pivot action is the angular movement. The backhoe body can be considered the object's center of mass (COM).

In rigid body simulation, each body has a well-defined COM, mass, and inertia tensor. These properties are typically required for rigid body simulations. The COM defines the frame, i.e., point, around which rotation occurs. Mass can be a scalar quantity representing the relationship between linear velocity and linear momentum, and also the relationship between forces and accelerations. The inertia tensor is the rotational equivalent of mass. It can be a 3×3 matrix defining the relationship between angular velocity and angular momentum, and also between torques and angular accelerations. Rigid body simulations tend to utilize the inverse of these mass properties in the calculations, i.e., 1/m and Articulation simulations extend this concept by computing the spatial inertia matrix for each link. These can be 6×6 matrices that represent the mass and inertia of the articulation at each link. The matrix includes the rigid body mass/inertia of the link's body and, additionally, the accumulated mass/inertia of the suspended load, i.e., the mass/inertia of child links, grandchild links, and any additional links. The spatial inertia matrix is calculated recursively from tip-to-root, where the links' spatial inertias, where the links have no children, are equivalent to their rigid body mass/inertia. The positional offsets between the joint anchors and the respective link's COMs are factored into these calculations so that the spatial inertia also includes COM information. As with rigid body simulations, the inverse of the spatial inertia is generally what can be used in the majority of calculations.

Simulations that include rigid body objects can use a rigid body solver to help execute the simulation modeling. The solvers, such as projected gauss seidel (PGS) and Jacobi algorithms, can take in a set of parameters relating to the objects of the simulation, run through a set of iterations using those parameters, and output an updated set of parameters. The parameters can include a position of each of the objects being simulated, the linear velocity of each of the objects, the angular velocity of each of the objects, joint positioning relative to the other links in the object, and constraint information. Constraints are limits that can be imposed on the simulation modeling. For example, the scooper on a backhoe cannot linearly move independently of the arm segment it is attached to. Those two objects have to move linearly together. The scooper can move angularly, i.e., rotate, independently. Simulating a human elbow or knee requires that movement between the two arm or leg segments be limited. The constraint is that they can be bent generally in one direction, with some minor rotation as well.

PGS and Jacobi are two kinds of solvers that can solve Jacobians (a constraint row, which can either be stored in matrix or vector form). The vector form can be solved more efficiently and takes up less space, and requires specialized code for a given kind of constraint, whereas the matrix form can be solved using generic code to solve different kinds of constraints. The solvers, when they execute their respective algorithms, can introduce excess energy into the simulation when correcting errors, such as when one object is rotating at a high velocity. They can also introduce error. This can occur because the existing solvers use linear analysis in their respective algorithms. Angular movement may have to be estimated. Fast angular velocities may also increase the bias because they may produce more error.

Existing solvers can experience inefficiencies with the positional constraints of joints where the anchor location is offset from the COM of the respective bodies. In this case, the translational velocities of the jointed bodies should be an arc centered on the joint location. These can become the tangents to the arc sampled at each time step. Integrating the tangents produces error. Even in cases where the linear solver successfully solved the constraints, integration error can still be introduced. The non-linear relationship may not be handled correctly by the existing linear solvers. When the time step is sufficiently small, or the angular velocity is sufficiently small, then integrating the tangents can match the idealized arcs well, therefore, the error can be small. When the time step is large, or the angular velocity is large, then integrating the tangents can diverge from the idealized arc significantly, thereby, producing error and separation.

In addition, existing rigid body solver algorithms may not resolve to a steady state under certain circumstances. For example, they may not be able to handle a high mass to velocity ratios. Simulating small objects may be difficult at the velocity requested. Stacking one cubic meter cubes at 60 hertz (Hz) may be acceptable for a certain simulation, while stacking one cubic centimeter cubes at 60 Hz can introduce instability of the stacking. Long links, i.e., chains of joints, may increase the error at each joint.

Common workarounds on traditional rigid body solvers are to: (1) increase the number of iterations, (2) sub step the simulation, (3) tweak the mass ratios, (4) simplify the inertias to ensure always diagonally dominance, (5) globally scale the inertia tensors to bias the impulse to produce more linear effect and less angular effect, (6) use joint projection to recover from larger errors, (7) limit angular velocity, and (8) implement additional distance constraints to hold systems together. The workarounds can apply additional constraints, and incur additional error, to a simulation that would not normally be present.

There can be situations where the additional constraints may cause an undesirable result from the solver. Substepping and running more solver iterations are solutions that can be considered as solver improvements. Techniques that alter the mass properties may not be accurate enough for simulations where the desired results should be as similar to reality as possible. Furthermore, the introduction of additional constraints, for example, distance constraints, may produce behavior that is similar to the physical world under certain circumstances. The problem of the additional constraints can be that it can make it difficult to extract useful secondary information from the simulation, such as the applied forces at a joint, since additional artificial constraints were introduced to hold the system together. The secondary values can be useful to extract meaningful information from the simulation, for example, the applied force on a spring could be used to gauge the weight of an object, such as when implementing a mechanical scale using a rigid body solver.

The disclosure demonstrates a non-linear rigid body solver, i.e., temporal gauss seidel (TGS), which can have similar performance as that to traditional solvers. TGS can improve high mass ratio handling, simulating small objects, simulating long links of joints, and relatively fast angular velocities. The TGS solver uses a small time interval value to iterate through the solver at small time steps. The time interval value can be a time period or portion, for example, one tenth of a second, divided by a number of iterations, for example, three. The solver would then step through the simulation, in this example, at ~0.033 seconds per step. Each object can be moved utilizing the parameters, such as the linear velocity and angular velocity, of each object. It can apply the provided constraints and adjust the bias and update the simulation. The solver can then repeat the steps until the number of iterations are completed. TGS can also be applicable outside of physics simulations as a general linear and non-linear iterative solver, e.g., for mixed linear complementarity problems (MLCP).

The TGS rigid body solver extends the PGS algorithm, and can also be applied to the Jacobi algorithm, by advancing the rigid body solver using the above described time interval value to iteratively resolve constraints and bias. The time step can be identified by dt, and a specified number of iterations can be identified by N. The time interval value is equal to dt divided by N, for example, $$\left(\frac{dt}{N}\right).$$

TGS can mitigate linearization artifacts and can establish a bias that is proportional to the inverse of dt multiplied by N, for example, $$\left(\frac{1}{dt}*N=\frac{N}{dt}\right).$$

This can increase the TGS convergence and provide for a better high mass ratio handling due to the stronger bias values. In addition, the stability of the simulation can be increased due to a larger bias component or a smaller error using a small time step and the bias can be corrected using a bias coefficient proportional to $$\frac{1}{dt}.$$

In simulations of stacking or with simulations where one of the objects has a large mass relative to the other object, the bias can be the dominant factor in the constraints. Since the bias is proportional to the inverse of the time step, as the time step decreases, the solver's convergence rate increases. This can produce better results than simulating the contact with a greater number of iterations at a larger time step.

Utilizing the time step proportion can provide a better convergence than utilizing a smaller time step through carrying over applied forces between the iterative time intervals. This approach is similar to warm-starting the rigid body solver with the added benefit of reducing energy introduced to correct errors. In other aspects, a better enforcement of velocity drives can be provided by integrating the velocity target to produce a bias from the second solver iteration, thereby satisfying the velocity drives. In other aspects, some of the calculations can be pre-computed thereby reducing the number of calculations performed within each iteration of the rigid body solver.

In addition to joint and contact simulations, another use of rigid body solvers is in the area of articulation simulations, such as a rigid body articulation solver. A common algorithm is Featherstone's articulated body algorithm (ABA). ABA can generate energy due to its use of the Coriolis and centrifugal terms, which can introduce forces proportional to velocity squared. As the velocity increases, energy can be introduced if the integrator being used is not very accurate. A common workaround is to heavily dampen the simulation to reduce the energy gained. Damping can result in a divergence of the simulation from analytical models, meaning it can be less accurate and therefore potentially less suitable for industrial simulations. An adaptive time interval, as described herein, can be used to mitigate energy gain in the simulation to produce an acceptable result without significantly increasing the simulation cost.

The motion and pose of links in the articulation can be defined utilizing velocities and positions (angles) stored in the joint frames, which can define the relative orientation and velocity between the parent and child links Articulations do not directly support closed loops, instead requiring supplemental code to process loops, contacts, and limits. Unlike the implicit constraints in the kinematic tree, these loop constraints can be violated and errors may need to be corrected. These loop constraints, limits, and contacts can be solved using a traditional rigid body solver, allowing them to interact with other articulations, traditional rigid bodies, and other simulated actors in the simulation.

The motion of the articulation can be defined relative to the root link, which can be either free or fixed. When fixed, the root link is an immoveable object and the motion of the links is entirely defined by the joint-space velocities. These velocities can be integrated into joint positions (angles), which can be used to define the relative pose between the parent and child links.

When the root link is free, the motion of links can utilize the motion of the root link, which is integrated as if it were a free rigid body. Links, besides the root link, can follow a non-linear orbital behavior due to the way the angles, i.e., offsets, are integrated from joint velocities, while the root link follows a path defined by its linear and angular velocity vectors. This can cause an issue when, for example, positional constraints are used to connect links. If a positional constraint is used to connect the root link, e.g., to implement picking in a game engine, this behaves acceptably. If the link picked is not the root link, the joint solver can fail to fully satisfy the constraint because the motion caused by the impulse applied by the solver does not follow a predictable linear path assumed by the linear constraint solver.

Furthermore, errors when integrating the root link, whose integration is linear, can introduce further errors at the location of the anchor, i.e., the connection point between a first and second object. This accumulation of error can lead to energy being introduced into the system. This error accumulation can be overcome by using very small time steps in the simulation. This can significantly increase the computational cost of the simulation.

A contact simulation, using the TGS, occurs when a rigid body comes in contact with a second rigid body (see, for example, FIG. 1). For example, a robotic arm touching a box, or one box placed onto of a second box. Contact simulations can utilize a coarser approximation since the velocities of the rigid bodies tend to be slower in comparison to their respective masses in cases where linear solvers may produce simulation errors. Stacking and piling actions are representative contact simulations. The tangent velocities used by linear solvers at the points of contact can produce the desired rolling behavior for contacts with friction. In this case, the linearization artifacts do not impact the simulation. The results can be a close approximation to the desired behavior so there does not have to be a need to change the model to a non-linear model for the velocity at the contact point.

The contact simulation can be implemented by precomputing the Jacobian vector and the impulse response vector. In an alternative aspect, the Jacobian vector and the impulse response vector can be the same vector when the angular velocity is stored scaled by the square root of the inertia tensor.

Formula 1: Example angular velocity proportion when the Jacobian vector and impulse response vector are the same vector $$\omega = \sqrt{I} * \omega$$

where $\omega$ is the angular velocity and $I$ is the inertia tensor of a rigid body.

In the contact simulation, the time step proportion can be utilized by accumulating a linear delta and an angular delta for the first and second rigid bodies involved in the contact. The linear delta and the angular delta are initialized to the zero vector. The accumulation step is executed after each iteration has completed, i.e., after the constraints have been solved (see, for example, FIG. 2).

Formula 2: Linear delta and angular delta accumulation example $$\Delta p_i = \Delta p_i + \left(v_i * \frac{dt}{N}\right)$$

$$\Delta \theta_i = \Delta \theta_i + \left(\omega_i * \frac{dt}{N}\right)$$

where $\Delta p_i$ is the linear delta of a rigid body i,
$v_i$ is the linear velocity of a rigid body i,
$\Delta \theta_i$ is the angular delta of a rigid body i,
$\omega_i$ is the angular velocity of a rigid body i.

The bias component can be updated utilizing the linear delta and angular delta computed in Formula 2. The bias update can utilize example Formula 3.

Formula 3: Updating bias example $$\text{bias} = \text{bias} + \left((N^{lin} \cdot (\Delta p_0 - \Delta p_1) + (raXnI \cdot \Delta \theta_0) - (rbXnI \cdot \Delta \theta_1)) * \frac{dt}{N}\right)$$

where $N^{lin}$ is the normal linear vector, i.e., normal vector,
  $\Delta p_0$ and $\Delta p_1$ are the linear deltas for the first and second rigid bodies, respectively,
  raXnI is the current angular offset from the first rigid body's COM,
  rbXnI is the current angular offset from the second rigid body's COM,
  $\Delta\theta_0$ and $\Delta\theta_1$ are the angular deltas for the first and second rigid bodies respectively.

Alternatively, the dot product of the linear delta of the first rigid body can be constant for the contacts that share the same normal. Therefore, this portion of Formula 3 can be pre-computed and the result treated as a constant for the bias update computation. For example, $(\Delta p_0 - \Delta p_1)$ can be computed prior to entering the TGS iterations loop and its resultant value can be treated as a constant in Formula 3.

Figure 3:
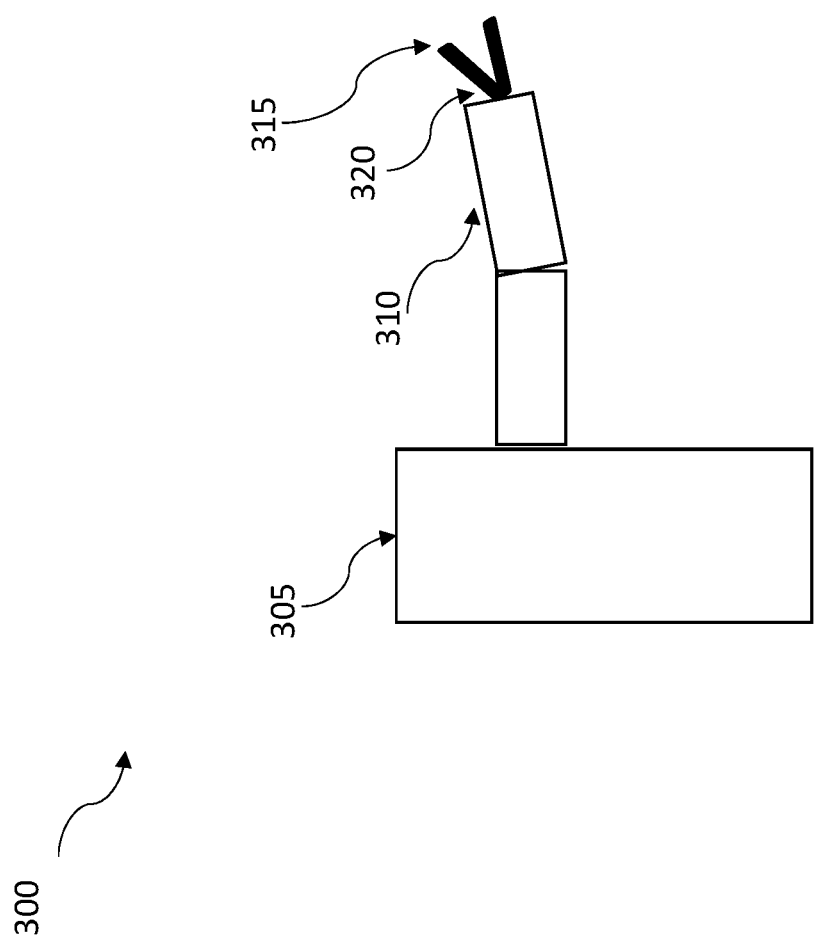
FIG. 3 is an illustration of a diagram of an example joint model simulation.

A joint simulation, using a rigid body solver, occurs when a rigid body has a common joint with a second rigid body (see, for example, FIG. 3). For example, a robotic arm where the hand and arm are connected. Joint simulations can utilize a similar rigid body solver as the contact simulation in situations where the two rigid bodies are changing velocities slowly relative to their respective masses. When the velocities are higher, such as if one of the rigid bodies is shaking or spinning, a finer approximation may need to be used. For example, a robotic arm spinning a baton. This example can lead to a velocity change of an object proportionately higher, as compared to the object's mass, where the proportionality is higher than the contact simulation can handle.

Figure 4:
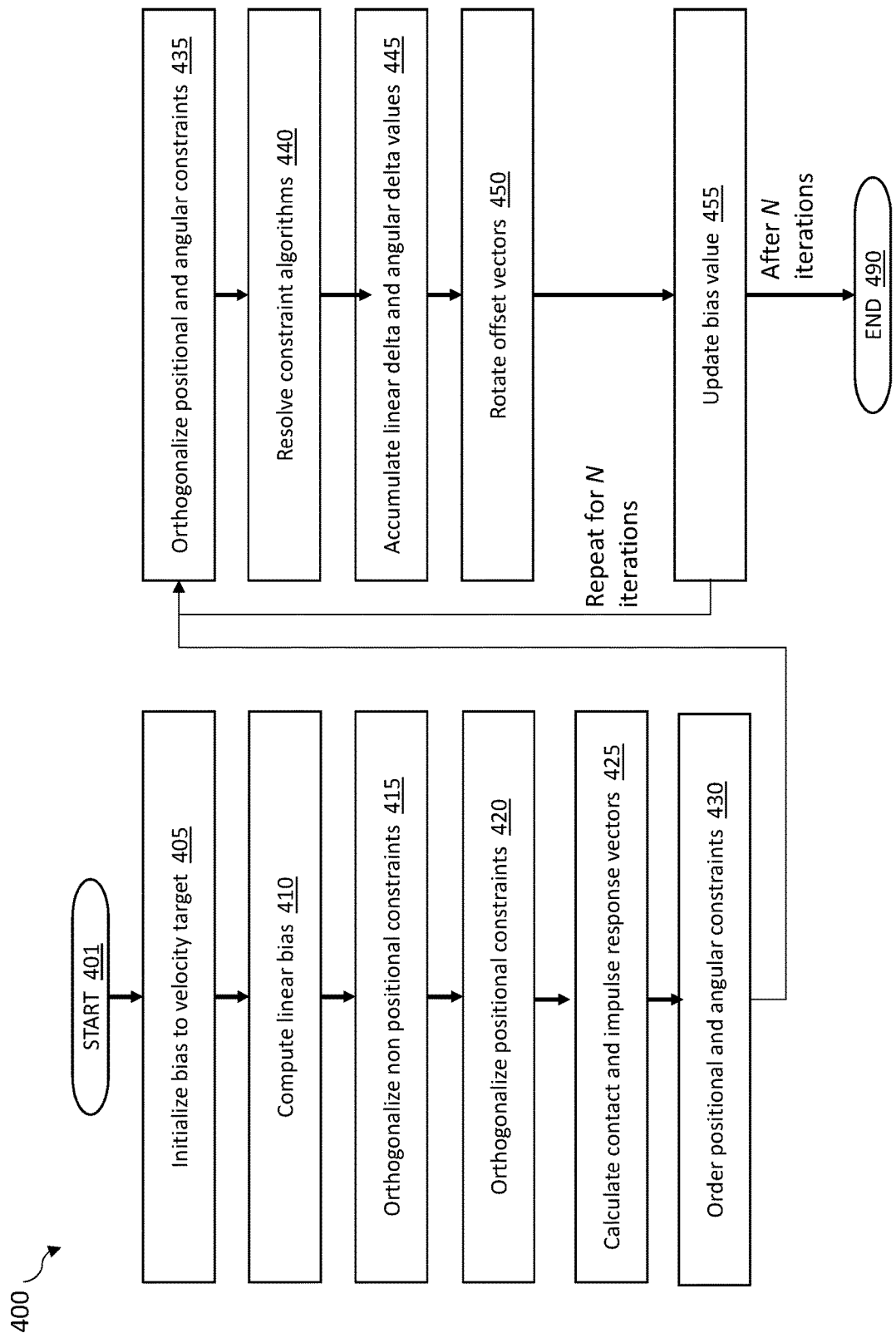
FIG. 4 is an illustration of a flow diagram of an example method for resolving a joint model simulation.

Building on the contact simulation, the joint simulation can also include a process to calculate a new bias value utilizing an updated positional constraint and an updated angular constraint (see, for example, FIG. 4). The bias value can be added to the positional constraint and angular constraint, as shown in formula 4.

Formula 4: Updating bias with a positional and angular constraints example bias=bias+positional constraint bias=bias+angular constraint The positional constraint utilizes the dot products of the first and second rigid body's linear delta value, and a dot product of the changes of angular position for each of the first and second rigid bodies. This is shown in formula 5.

Formula 5: Positional constraint calculation example positional constraint=$(p_0 \cdot \Delta p_0) - (p_1 \cdot \Delta p_1) + ((cur\_r_0 - init\_r_0) \cdot \theta_0) - ((cur\_r_1 - init\_r_1) \cdot \theta_1) + \tau^* accum\_dt$ where $cur\_r_0$ and $cur\_r_1$ are the current offset vector from the respective first and second rigid body's COM to the respective anchor position. The anchor position can be the joint location or the contact position,
  $init\_r_0$ and $init\_r_1$ are the initial offset vectors from the respective first and second rigid body, $\tau$ is the target velocity,
  accum_dt is the accumulated elapsed time at the point of the iteration being evaluated.

The angular constraint utilizes the dot products of the first and second rigid body's angular delta value and current angular position, along with a target velocity and accumulated dt. This is shown in formula 6.

Formula 6: Angular constraint calculation example angular constraint=$(\theta_0 \cdot \Delta\theta_0) - (\theta_1 \cdot \Delta\theta_1) + \tau^* accum\_dt$ In addition, the joint rows can be orthogonalized. The constraints can be ordered so that the angular locked axis constraints appear before other axes, such as non-angular locked axis constraints. The positional constraints are orthogonalized against the angular locked axes. Other constraints can be orthogonalized during the constraint prep phase since the positional updated $r_0$ and $r_1$ vectors are utilized with positional constraints. Due to the non-linear nature of articulations, the change of the linear velocity of a link caused by a force in a particular direction is not guaranteed to be in the same direction as the force. The same is true for torques. Therefore, it may not possible to orthogonalize the constraints to guarantee Jacobian rows are independent when simulating articulations. Orthogonalization can improve solver convergence with the TGS solver when simulating rigid bodies. It may not be performed when simulating articulations due to incompatibilities between orthogonalization and articulations.

In addition to the contact and joint simulations discussed above, the TGS solver can also be applied to articulation simulations. An articulation simulation can occur when two or more rigid bodies are attached and in motion. For example, a simulation of a backhoe where there is a backhoe body, two arm sections, and a scoop section. Each of the backhoe components control the movement of the next component attached, moving away from the COM of the rigid body, which is the backhoe body. For example, the backhoe body can influence the motion of the first arm section. The first arm section can influence the motion of the second arm section and the second arm section can influence the scoop section. This disclosure presents a method to resolve the deficiencies of the existing solvers for articulation simulations. The accumulation of energy by the Coriolis and centrifugal forces can be resolved without lowering the accuracy of the simulation compared to analytical models and without compromising the usage of inverse dynamics to drive the simulation. In addition, the simulation can limit the introduction of excess energy when external constraints are solved that influence non-root links.

The articulation simulation utilizing the TGS solver can be implemented by solving the TGS solver as described above with optional damping and velocity clamps, i.e., constraints, which are processed with forces to ensure a constant internal state of the articulation. When an external constraint exists, then the system computes the velocities of each component of the articulation, starting at the root link, since the root link influences the remaining links Utilizing the time interval value, each link in the articulation can be stepped forward and the position and velocities of each link can be re-computed. This approach mitigates a deficiency with the PGS solver. In PGS solver algorithms, where the constraints interact with non-root links, the linear approximation to motion expected by the PGS solver does not match the non-linear motion produced by the non-root links.

Turning now to the figures, FIG. 1 is an illustration of a diagram of an example contact model simulation 100. Contact model simulation 100 is demonstrating a contact between two rigid bodies, a block and a stack of blocks. Contact model simulation 100 includes a robotic arm 110 holding a block 120. Block 120 is being placed on top of stack of blocks 124. Element 126 identifies the contact patch, i.e., the point of contact between the block 120 of a rigid body and the stack of blocks 124. The TGS solver can be used to produce a result, i.e., updated positions, velocities, and constraints, for block 120 and stack of blocks 124.

Figure 2:
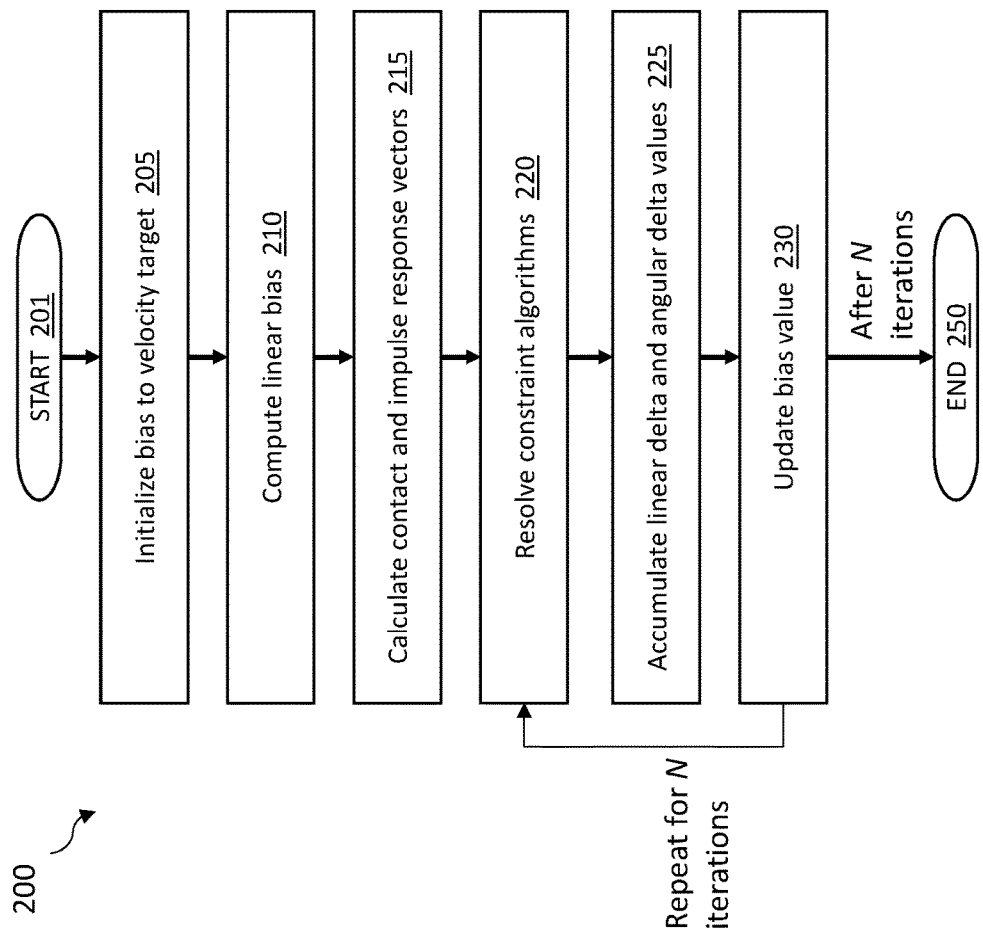
FIG. 2 is an illustration of a flow diagram of an example method for resolving a contact model simulation.

FIG. 2 is an illustration of a flow diagram of an example method 200 for resolving a contact model simulation. The method 200 starts at a step 201 and proceeds to a step 205. At the step 205, a bias can be initialized to a default value, such as a value of the velocity target. Utilizing the velocity target can increase the enforcement of velocity drives thereby increasing the convergence to a solution. Proceeding to a step 210, a linear bias can be computed using the initialized bias value. The linear bias can utilize the linear delta and angular delta values as demonstrated in Formula 3. A portion of the linear bias computation can be pre-computed, prior to the step 201 and the pre-computed value can be treated as a constant when computing the linear bias. Proceeding to a step 215, the contact vector and the impulse response vector between two rigid bodies can be calculated. In some aspects, the contact vector and the impulse response vector can be the same vector, such as storing the angular velocity as a proportion of the inertia tensor of the rigid body. When the same vector, one of either the contact vector or the impulse response vector would need to be calculated.

In a step 220, the solver can resolve the constraint equations, i.e., algorithms. The constraint equations represent the objects and the constraints on their movement within the simulation system. For example, an object may not be able to move below the surface of another object, such as the surface of the ground. These constraint equations can be the same or different for each simulation being solved. In step 225, the linear delta value and the angular delta value for each of the rigid bodies can be updated by computing a time interval portion of the change in the position (for the linear delta) and in the angular velocity (for the angular delta). Formula 2 demonstrates an example algorithm for updating the linear delta values and the angular delta values. The $$\frac{dt}{N}$$

time interval is used to apportion the respective linear and angular velocities across the respective linear delta value ($\Delta p_i$) and angular delta value WO accumulators. Proceeding to a step 230, the bias can be updated utilizing the updated linear delta value and the updated angular delta value. The bias update can again be demonstrated using Formula 3. In this iteration, the linear delta value and the angular delta value have been updated in the step 225. In addition, the updated current angular offsets for the first and second rigid bodies have been determined in the step 220. The method 200 returns to the step 220 for the determined N number of iterations within the solver step. After the N number of iterations has been completed, the method 200 ends at a step 250. In another aspect, the method 200 can exit earlier than the N number of iterations if the solver detects a change in position and velocity below a targeted level, i.e., a convergence level has been reached and further iterations are not likely to improve the convergence significantly.

FIG. 3 is an illustration of a diagram of an example joint model simulation 300. Joint model simulation 300 is demonstrating a joint movement between two connected rigid bodies. Joint model simulation 300 includes a robotic mechanism 305, a robotic arm 310, and a clasper 315. Between the robotic arm 310 and the clasper 315 is a joint 320. Joint 320 can experience various types of movement, for example, side to side, rotation, and other combinations of movement. The TGS solver can generate a result for the joint movement between the two rigid bodies, robotic arm 310 and clasper 315.

FIG. 4 is an illustration of a flow diagram of an example method 400 for resolving a joint model simulation. The method 400 starts at a step 401 and proceeds to a step 405.

At the step 405, the bias can be initialized to a value of the velocity target. Utilizing the velocity target can increase the enforcement of velocity drives thereby increasing the convergence to a solution. At a step 410, the linear bias can be computed. The linear bias can utilize the linear delta and angular delta values as demonstrated in Formula 3. A portion of the linear bias computation can be pre-computed, prior to the step 401 and the pre-computed value can be treated as a constant when computing the linear bias. At a step 415, the non-positional constraints can be orthogonalized. The constraints can be ordered so that the angular locked axis constraints are evaluated prior to other axes. Orthogonalization can reduce the time to achieve a targeted solver convergence.

Proceeding to a step 420, the positional constraints can be orthogonalized. The positional constraints are typically orthogonalized against the angular locked axes. The non-positional constraints are orthogonalized prior to the positional constraints since the $r_0$ and $r_1$ vectors are utilized with the positional constraints. Proceeding to a step 425, contact and impulse response vectors can be calculated. In some aspects, the contact vector and the impulse response vector can be the same vector, such as storing the angular velocity as a proportion of the inertia tensor of the rigid body. When the same vector, one of either the contact vector or the impulse response vector would need to be calculated.

In a step 430, the order of the positional and angular constraints can be determined. A positional constraint algorithm is demonstrated by Formula 5, where the position is computed from the current relative offsets from the original anchor positions of each rigid body. Each respective offset is modified by the time interval proportion. An angular constraint algorithm is demonstrated by Formula 6, where the angular offset from the original anchor position is calculated using the time interval proportion. In a step 435, the linear and angular constraints are orthogonalized. Similar to steps 415 and 420, the constraints can be orthogonalized to improve solver convergence rates using fewer iterations.

In step 440, the constraint algorithms and equations can be resolved. The constraint equations represent the objects and the constraints on their movement within the simulation system. For example, an object may not be able to move below the surface of another object, such as the surface of the ground. These constraint equations can be the same or different for each simulation being solved. In a step 445, the linear delta values and the angular delta values can be updated utilizing a proportion of the respective linear and angular changes, proportional to the time interval value. Formula 2 demonstrates an example algorithm for updating the linear delta values and the angular delta values. The $$\frac{dt}{N}$$

time interval is used to apportion the respective linear and angular velocities across the respective linear delta value ($\Delta p_i$) and angular delta value ($\Delta \theta_i$) accumulators.

In a step 450, the offset vectors can be re-calculated. This can be represented as a rotation of the offset vector utilizing the angular delta value. The current rotated offset vector is demonstrated as cur_$r_0$ and cur_$r_1$ in Formula 5. The offset vectors utilize the quaternion unit vectors to indicate angular changes due to a change in the first object affecting second object. Proceeding to a step 455, the bias can be updated utilizing the values computed above. The bias update can again be demonstrated using Formula 3. In this iteration, the linear delta value and the angular delta value have been updated in the step 445. In addition, the updated current angular offsets for the first and second rigid bodies have been determined in the step 450.

The method 400 can return to step 435 and repeat the method 400 steps for an N number of iterations. The method 400 can also exit prior to the completion of N number of iterations if a change in value is lower than a targeted level. For example, if additional iterations would not significantly improve the result parameters. When no further iterations are being processed, then the method proceeds to a step 490 and ends.

Figure 5:
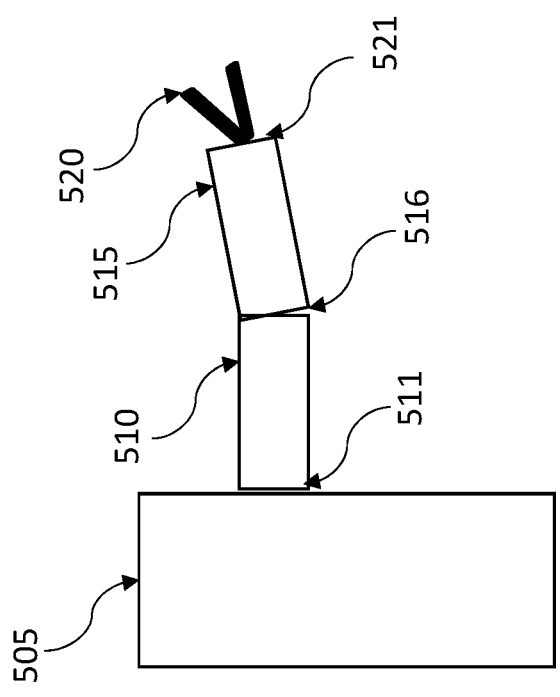
FIG. 5 is an illustration of a diagram of an example articulation model simulation.

FIG. 5 is an illustration of a diagram of an example articulation model simulation 500. Articulation model simulation 500 is demonstrating an articulation movement between 4 rigid bodies that are linked together. Articulation model simulation 500 includes a robotic base 505, a first arm section 510, a second arm section 515, and a clasper 520. Robotic base 505 can be considered the root link for the articulation model simulation 500. Robotic base 505 can be fixed, such as in a classical robotics case, or free, such as in the case of Featherstone articulations. The first arm section 510 is attached to the robotic base 505 at anchor point 511. Second arm section 515 is attached to the first arm section at anchor point 516. The clasper 520 is attached to the second arm section at anchor point 521. First arm section 510, second arm section 515, and clasper 520 are non-root links of the articulation model simulation 500. If first arm section 510 moves, then second arm section 515 and clasper 520 are also moved positionally and angularly. The TGS solver can generate a result for the articulation model simulation 500.

Figure 6:
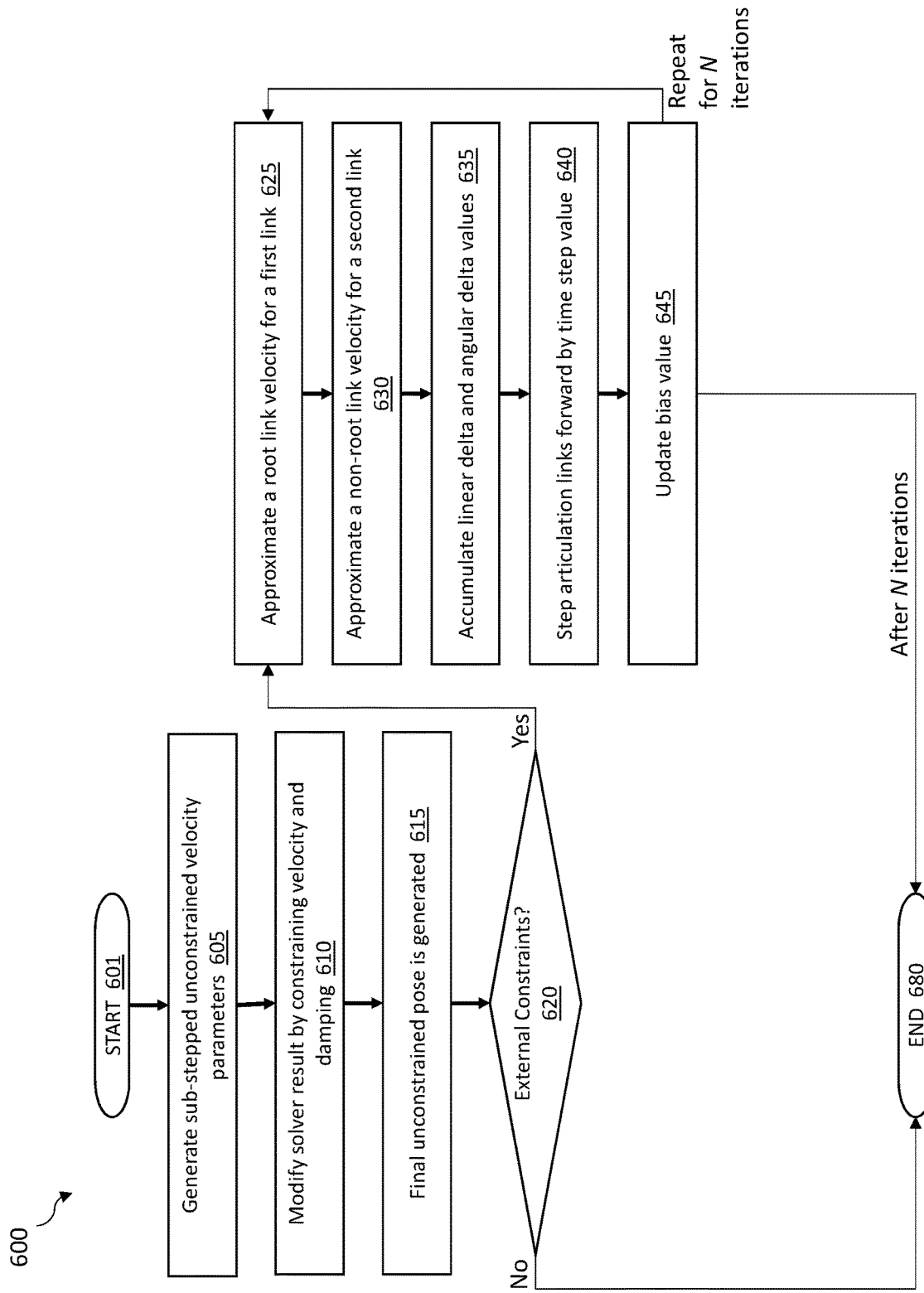
FIG. 6 is an illustration of a flow diagram of an example method for resolving an articulation model simulation.

FIG. 6 is an illustration of a flow diagram of an example method 600 for resolving an articulation model simulation. The method 600 can be used to mitigate issues with articulations where constraints interact with non-root links Method 600 starts at a step 601 and proceeds to a step 605. In the step 605, a sub-stepped unconstrained velocity solver computation is generated on the set of articulation links Step 605 can be performed similar to method 200 and can be used to overcome instability due to the Coriolis force caused by an inaccurate computation.

Proceeding to a step 610, the solver result from step 605 can be modified by constraining the unconstrained velocity value and introducing constraint clamps on the solver, and then re-generating the solver results. These additional constraints can be processed using forces to ensure that the articulation's internal state is kept in a consistent state. This can help to minimize the number of sub-steps required by the computations. Step 610 is an optional step. In many robotics cases, the velocities are sufficiently low that a single step at 60 Hz can be used for stability. The Coriolis force is proportional to velocity$^2$, so as velocities become larger, sub-stepping or clamping/damping becomes a more important step to include in the solver method.

Proceeding to a step 615, a final unconstrained pose for the articulation links can be generated. Due to the limitations of articulation simulations, the rigid body articulation can be computed in a final state. Proceeding to a decision step 620, if there are no external constraints, then the method ends at a step 680. If there are external constraints, then the method 600 proceeds to a step 625. An external constraint can be a factor preventing the articulation to fully move in the way requested. For example, a robot arm moving in a weightless environment will move differently than a robot arm moving on the surface of the Earth where gravity provides an external constraint on the simulation. Other examples can include moving under water or if there is another object blocking the articulation path, such as a ceiling or a wall.

In a step 625, an approximate velocity for the root link is computed. The velocity can be estimated utilizing the pose difference of the root link. The root link can be fixed, i.e., immovable, or free. The root link is the relative root of the articulation for the current iteration of the simulation. Each link of the articulation can be considered the root link during the respective link's iteration. Since the root link influences the remaining links in the articulation and so should be evaluated prior to the remaining links. In a step 630, the velocity of the non-root links can be estimated utilizing a difference in the joint angles which are then projected by a joint motion matrix. The non-root velocities can be utilized to compute adjustments to the linear and angular delta values. In a step 635, the joint velocity can be recomputed utilizing the joint constraints. This can be added to the current joint velocity and the delta changes are integrated into the joint positioning parameters. The links can follow a non-linear orbital path due to the offsets are integrated from the joint velocities.

Proceeding to a step 640, the articulation links can be stepped forward by the time interval value. The value of N, in this aspect, is the number of iterations using the delta velocities produced by constraint correction impulses. At a step 645, the joint and contact bias can be recomputed as part of the TGS algorithm. The linear bias utilizes the linear delta and angular delta values as demonstrated in Formula 3. A portion of the linear bias computation can be pre-computed, prior to the step 601 and the pre-computed value can be treated as a constant when computing the linear bias. The method 600 can return to step 625 for an N number of iterations. After N number of iterations or if an exit condition is true, then the method 600 proceeds to the step 680 and ends.

The optimization requiring one vector, as described in FIG. 2, step 215, can be possible with constraints between rigid bodies. For constraints effecting articulations, the spatial inertia matrix may not be a linear projection of the velocity, so a secondary response vector can be required to define the change in linear and angular velocity that will be produced by the constraint. The response vector cannot be efficiently calculated directly using the mass properties of the articulation. They can be indirectly computed by propagating an impulsive force of magnitude 1 in the direction of the constraint's Jacobian rows, for each Jacobian through the articulation. The change in velocity that these impulses produce can be recorded. From this, a unit response value can be calculated by projecting the response vector onto the original Jacobian. The unit response can be multiplied by the desired change in velocity in the direction of the Jacobian to produce the magnitude of the impulsive force required to effect the change. The response vector can be stored so it can be scaled by the magnitude of the applied force to compute the change in velocity that will be affected by the applied forces.

A conceptually equivalent value can be computed for rigid body collisions using the closed form rigid body equation a shown in Formula 7.

Formula 7: Impulse propagation for rigid body collisions example $$\text{bias} = \text{bias} + \frac{1}{\left(\frac{1}{m_0} + (raXn \cdot raXnI_0^{-1}) + \frac{1}{m_1} + (rbXn \cdot rbXnI_1^{-1})\right)}$$

where $m_0$ and $m_1$ are the masses for the first and second rigid bodies, respectively, raXn and rbXn are the offsets from the COM to the contact or joint location for the first and second rigid objects, respectively,
$raXnI_0^{-1}$ and $rbXnI_1^{-1}$ are the offsets from the COM multiplied by the inverse inertia tensors for the first and second rigid bodies, respectively.

Formula 7 can produce an equivalent scalar impulse response value for a pair of rigid bodies. When the constraint contains a mixture of rigid bodies and articulations, the response for the rigid body component will be computed using Formula 7 while the response for the articulation will be computed using the impulse propagation method.

The impulse response vector for an articulation link differs from the impulse response for a rigid body because it may not be in the same direction as the Jacobian vectors. This is different from rigid body simulation, where the response to an impulse projects exactly onto the Jacobian directions. Where a significant proportion of the articulation's impulse response vector does not project onto the Jacobian, a linear solver like PGS may accumulate significant error. The simulation may become unstable if small time-steps are not used. The TGS solver, utilizing continually adjusted constraints, can identify the increasing error and adjust the biases to correct for the errors. In addition, TGS can update velocities to account for non-linear motion of links around joints, producing less error and more stable simulations.

Figure 7:
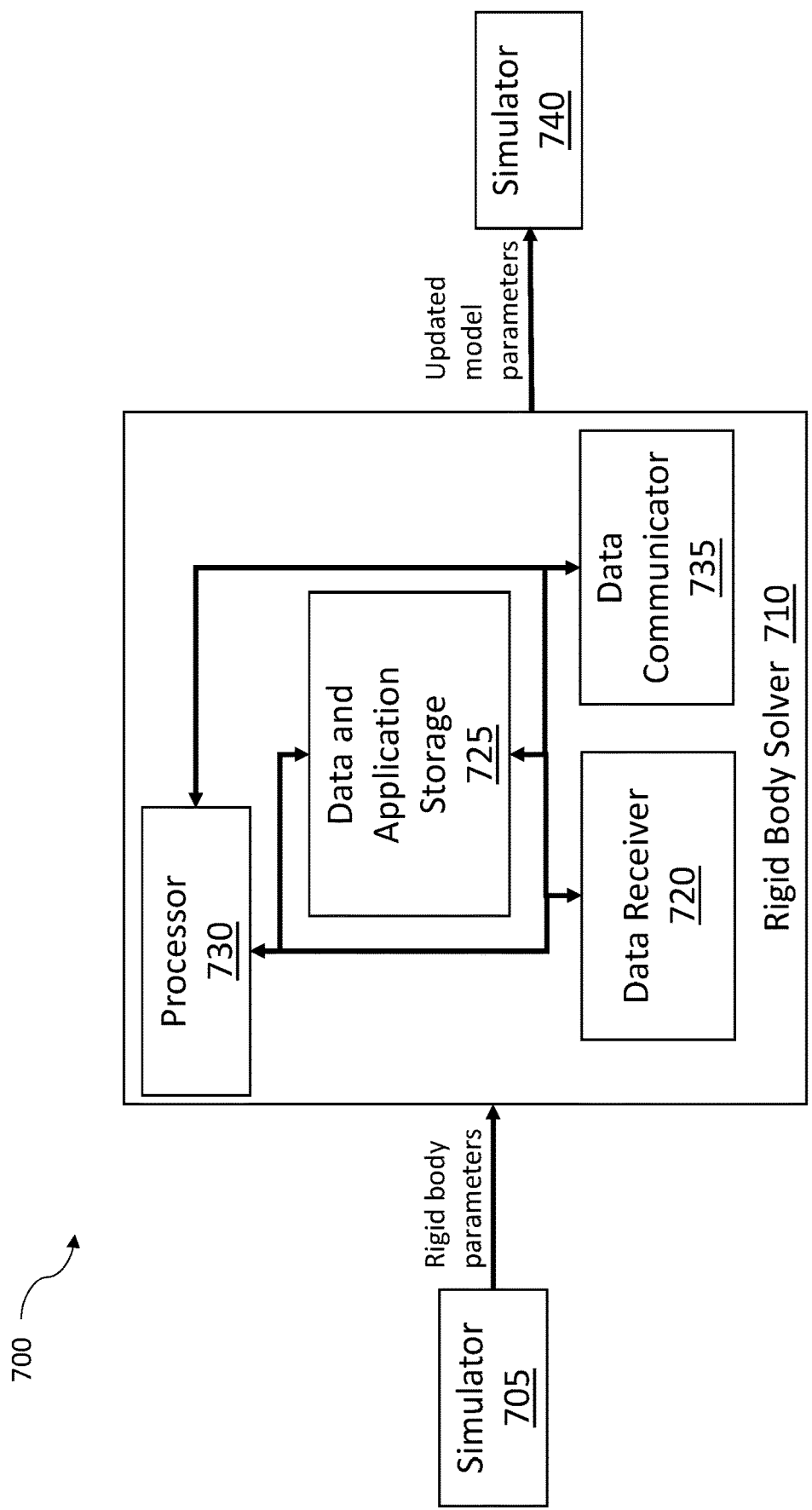
FIG. 7 is an illustration of a block diagram of an example rigid body solver system.

FIG. 7 is an illustration of a block diagram of an example rigid body solver system 700. System 700 can receive a set of rigid body solver parameters and can return a result of a set of parameters including updated positions, velocities, and constraints of the rigid body model. Solver system 700 includes a simulator 705, a rigid body solver system 710, and a simulator 740. Rigid body solver system 710 includes a data receiver 720, a data and application storage 725, a processor 730, and a data communicator 735, each communicatively coupled to the other.

Simulator 705 can be a computing system, part of a computing system, an application, application module, subsystem, simulator, part of a mechanical device, and a local storage medium, such as a memory, hard drive, server, portable memory stick, CD, DVD, and other storage mediums. In an alternative aspect, simulator 705 can be located a distance from rigid body solver system 710, for example, a data center, cloud environment, and other location separate from the simulator 705. Simulator 705 is the source of the rigid body parameters for the rigid body solver system 710.

Data receiver 720 of the rigid body solver system 710 is capable of receiving the rigid body parameters. The data receiver 720 can store the rigid body parameters in the data and application storage 725 and provide them directly to the processor 730. Data and application storage 725 can be various storage mediums, such as processor registers, cache memory, local memory, and other storage mediums.

Processor 730 can generate the result parameters utilizing the rigid body parameters. Processor 730 can execute the TGS solver, using one or more of the different method forms 200, 400, and 600, or a combination thereof. The result parameters can be stored in data and application storage 725 and transmitted directly to other systems. Processor 730 can then indicate to the data communicator 735 that the result parameters, whether from the processor 730 or data and application storage 725, can be transmitted to the simulator 740. Simulator 740 can be the same simulator as simulator 705, for example, simulator 705 requesting the solver to generate a result and the result being returned to the simulator 705. In another aspect, simulator 740 can be a different simulator than simulator 705.

Rigid body solver system 710 can be one or more processors and chips, and be part of another processing system. Rigid body solver system 710 can be part of a computing system and it can be encapsulated within an application library, such as part of an application, sub-routine, dll, or other software component. Rigid body solver system 710 can be implemented in a graphics processing unit, central processing unit, and other processing systems.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

What is claimed is:

1. A method to resolve a rigid body solver of a real-time computing application simulation, comprising:
calculating a contact vector between a first object and a second object, and an impulse response vector between said first object and said second object, wherein said contact vector and said impulse response vector are determined using said first object as an origin;
accumulating a linear delta value and an angular delta value, for each of said first object and said second object, utilizing a time interval value, wherein said time interval value is computed utilizing a number of solver iterations (N-iter) and a time step (dt);
updating a bias value utilizing said contact vector, said impulse response vector, a linear bias value, and an angular bias value, wherein said linear bias value utilizes said linear delta value, and said angular bias value utilizes said angular delta value; and
simulating an interaction between said first and second objects in a real-time computing application by iterating said rigid body solver said N-iter times.

2. The method as recited in claim 1, further comprising:
calculating said linear delta value utilizing said time interval value and a linear velocity; and
calculating said angular delta value utilizing said time interval value and an angular velocity.

3. The method as recited in claim 2, further comprising:
calculating said linear bias value utilizing a first dot product of a normal vector relative to said first object and said linear delta value;
calculating said angular bias value utilizing a second dot product of a first offset vector and said angular delta value, and a third dot product of a second offset vector and a second angular delta value,
wherein said first offset vector is offset from a center of mass (COM) of said first object to a first anchor location, and said second offset vector is offset from said second object's COM to a second anchor location; and
recomputing said bias value utilizing said linear bias value, said angular bias value, and said dt.

4. The method as recited in claim 2, wherein said contact vector and said impulse response vector are a same vector, and further comprising:
calculating said angular velocity utilizing a second angular velocity of said first object and a square root of an inverse inertia tensor of said first object.

5. The method as recited in claim 1, wherein said linear bias value is calculated prior to said iterating and remains the same during said iterating, and wherein said first object and said second object have a same normal vector.

6. The method as recited in claim 1, wherein said bias value is initialized to a value utilizing a velocity target.

7. The method as recited in claim 1, wherein said iterating ends when an exit condition is satisfied.

8. The method as recited in claim 1, wherein said rigid body solver is a rigid body joint solver, and further comprising, prior to said updating a bias value:
rotating a current first offset vector and a current second offset vector utilizing said angular delta value;
calculating an angular constraint and a positional constraint; and
adding said positional constraint and said angular constraint to said bias value.

9. The method as recited in claim 8, wherein said angular constraint is calculated utilizing a first dot product of a first current angular velocity of said first object and said angular delta value of said first object, a second dot product of a second current angular velocity of said second object and said angular delta value of said second object, a current velocity target value, and an accumulated dt.

10. The method as recited in claim 8,
wherein said positional constraint is calculated utilizing:
a first dot product of a first current linear velocity of said first object and said linear delta value of said first object;
a second dot product of a second current linear velocity of said second object and said linear delta value for said second object;
a third dot product of an initial first offset vector subtracted from said current first offset vector and a first current angular velocity for said first object;
a fourth dot product of an initial second offset vector subtracted from said current second offset vector and a second current angular velocity for said second object;
a current velocity target; and
an accumulated dt; and
wherein said current first offset vector, and said initial first offset vector are vectors from a first COM of said first object to a first anchor location, and said current second offset vector, and said initial second offset vector are vectors from a second COM of said second object to a second anchor location.

11. The method as recited in claim 8, further comprising:
ordering said positional constraint and said angular constraint, wherein angular locked axis constraints are ordered prior to non-angular locked axis constraints.

12. The method as recited in claim 11, further comprising:
orthogonalizing said positional constraint utilizing said angular locked axis constraints.

13. The method as recited in claim 11, further comprising:
orthogonalizing non-positional constraints prior to iterating of said rigid body joint solver.

14. The method as recited in claim 1, wherein said rigid body solver is a rigid body articulation solver, further comprising:
generating an interim result, prior to said calculating, utilizing a sub-stepped unconstrained velocity solver;
wherein said first object is a first link of an articulation model and said second object is a second link of said articulation model, and said first link is a root link; and
wherein said accumulating of said angular delta value utilizes an unconstrained velocity value.

15. The method as recited in claim 14, further comprising:
modifying said interim result utilizing a velocity constraint and a damping constraint.

16. The method as recited in claim 14, wherein an external constraint exists, further comprising:
approximating a root link velocity value for said root link, utilizing an estimated velocity derived from a pose difference of said root link;
approximating a non-root link velocity value for said second link utilizing a difference in joint angles as projected by a joint motion matrix;
computing adjustments in said linear delta value and said angular delta value for each of said first link and said second link, utilizing said root link velocity value and said non-root link velocity value;
stepping said rigid body articulation solver by said time interval value; and recomputing said bias value utilizing said linear delta value and said angular delta value.

17. The method as recited in claim 16, wherein there exists more than one non-root link, and said approximating a non-root link velocity and said computing adjustments utilize each of said non-root links.

18. A computer program product having a series of operating instructions stored on a non-transitory computer-readable medium that directs a data processing apparatus when executed thereby to perform operations to generate a result from a rigid body solver, having operations comprising:
 calculating a contact vector between a first object and a second object, and an impulse response vector between said first object and said second object, wherein said contact vector and said impulse response vector are determined using said first object as an origin;
 accumulating a linear delta value and an angular delta value, for each of said first object and said second object, utilizing a time interval value, wherein said time interval value is computed, utilizing a number of solver iterations (N-iter) and a time step (dt);
 updating a bias value utilizing said contact vector, said impulse response vector, a linear bias value, and an angular bias value, wherein said linear bias value utilizes said linear delta value, and said angular bias value utilizes said angular delta value;
 simulating an interaction between said first and second objects in a real-time computing application by iterating said rigid body solver said N-iter times, wherein said iterating ends when an exit condition is satisfied; and
 communicating said result, wherein said result is a set of parameters representing said contact vector, said impulse response vector, said bias value, and constraint parameters.

19. The computer program product as recited in claim 18, wherein said rigid body solver is a rigid body joint solver, and further comprising, prior to said updating said bias value:
 rotating a current first offset vector and a current second offset vector utilizing said angular delta value;
 calculating an angular constraint and a positional constraint;
 adding said positional constraint and said angular constraint to said bias value; and
 wherein said set of parameters includes joint positioning parameters.

20. The computer program product as recited in claim 19, further comprising:
 orthogonalizing said positional constraint utilizing angular locked axis constraints.

21. The computer program product as recited in claim 18, wherein said rigid body solver is a rigid body articulation solver, further comprising:
 generating an interim result, prior to said calculating, utilizing a sub-stepped unconstrained velocity solver;
 wherein said first object is a first link of an articulation model and said second object is a second link of said articulation model, and said first link is a root link; and
 wherein said accumulating said angular delta value utilizes an unconstrained velocity value further comprising.

22. The computer program product as recited in claim 21, wherein an external constraint exists, further comprising:
 approximating a root link velocity value for said root link, utilizing an estimated velocity derived from a pose difference of said root link;
 approximating a non-root link velocity value for said second link utilizing a difference in joint angles as projected by a joint motion matrix;
 computing a change in said linear delta value and said angular delta value for each of said first link and said second link, utilizing said root link velocity value and said non-root link velocity value;
 stepping said rigid body articulation solver by said time interval value; and
 recomputing said bias value utilizing said linear delta value and said angular delta value.

\* \* \* \* \*